US010984959B1

United States Patent
Obaidat et al.

(10) Patent No.: US 10,984,959 B1
(45) Date of Patent: Apr. 20, 2021

(54) QUANTUM DOT-SENSITIZED SOLAR CELL AND METHOD OF MAKING THE SAME

(71) Applicant: UNITED ARAB EMIRATES UNIVERSITY, Al-Ain (AE)

(72) Inventors: Ihab M. Obaidat, Al Ain (AE); Sambasivam Sangaraju, Al Ain (AE)

(73) Assignee: UNITED ARAB EMIRATES UNIVERSITY, Al Ain (AE)

( * ) Notice: Subject to any disclaimer, the term of this patent is extended or adjusted under 35 U.S.C. 154(b) by 0 days.

(21) Appl. No.: 16/847,446

(22) Filed: Apr. 13, 2020

(51) Int. Cl.
*H01L 31/044* (2014.01)
*H01G 9/20* (2006.01)
*H01G 9/00* (2006.01)
*H01L 31/0224* (2006.01)
*H01L 31/0352* (2006.01)

(52) U.S. Cl.
CPC ......... *H01G 9/2031* (2013.01); *H01G 9/0029* (2013.01); *H01G 9/2004* (2013.01); *H01G 9/2022* (2013.01); *H01L 31/022466* (2013.01); *H01L 31/035218* (2013.01); *Y02E 10/542* (2013.01)

(58) Field of Classification Search
CPC ..... H01L 31/00–078; H01L 2031/0344; Y02E 10/50–60; H01G 9/20–204
USPC .................................................. 136/243–265
See application file for complete search history.

(56) References Cited

U.S. PATENT DOCUMENTS

| 9,349,971 | B2 * | 5/2016 | Snaith ................... H01L 51/422 |
| 9,880,458 | B1 * | 1/2018 | Irwin .................. H01L 51/0003 |
| 2012/0031490 | A1 | 2/2012 | Liu et al. |
| 2012/0085410 | A1 | 4/2012 | Wang et al. |
| 2012/0103404 | A1 | 5/2012 | Fuke et al. |
| 2020/0044102 | A1 * | 2/2020 | Sakai .................. H01L 51/4213 |

FOREIGN PATENT DOCUMENTS

| CN | 101950687 | * | 1/2011 |
| CN | 102592840 | A | 7/2012 |
| CN | 102723212 | A | 10/2012 |
| CN | 102903538 | A | 1/2013 |
| CN | 104091693 | A | 10/2014 |
| CN | 106935709 | * | 7/2017 |
| KR | 20130065987 | * | 3/2013 |

(Continued)

OTHER PUBLICATIONS

Jiang, Q., Zhang, X., You, J., SnO2: A Wonderful Electron Transport Layer for Perovskite Solar Cells, Small, 2018, 14, 1801154 (Year: 2018).*

(Continued)

*Primary Examiner* — Bach T Dinh
(74) *Attorney, Agent, or Firm* — Nath, Goldberg & Meyer; Richard C. Litman

(57) ABSTRACT

The quantum dot-sensitized solar cell (QDSSC) includes a photoelectrode, a counter electrode, and an electrolyte sandwiched between the photoelectrode and the counter electrode. The photoelectrode is formed from a titanium dioxide ($TiO_2$) layer, a cadmium sulfide (CdS) quantum dot sensitizer layer, and a tin dioxide ($SnO_2$) nanograss layer sandwiched between the titanium dioxide ($TiO_2$) layer and the cadmium sulfide (CdS) quantum dot sensitizer layer.

5 Claims, 8 Drawing Sheets

(56) References Cited

FOREIGN PATENT DOCUMENTS

| KR | 101838407 | * | 3/2018 |
| KR | 20180082183 | * | 7/2018 |

OTHER PUBLICATIONS

Wang, Y., Guo, M., Zhang, M., Wang, X., Facile Synthesis of SnO2 Nanograss Array Films by Hydrothermal Method (Year: 2010).*
Zhu, S., Wei., W, Chen, X., Jiang, M., Zhou, Z., Hybrid Structure of Polyaniline/ZnO Nanograss and Its Application in Dye-sensitized Solar Cell with Performance Improvement, Journal of Solid State Chemistry, 190, 2012, 174-179 (Year: 2012).*
Sambasivam et al., "Improved light-harvesting and suppressed charge recombination by introduction of a nanograss-like SnO2 interlayer for efficient CdS quantum dot sensitized solar cells," The Royal Society of Chemistry Advances, Nov. 21, 2019, 9, 38047-38054.

* cited by examiner

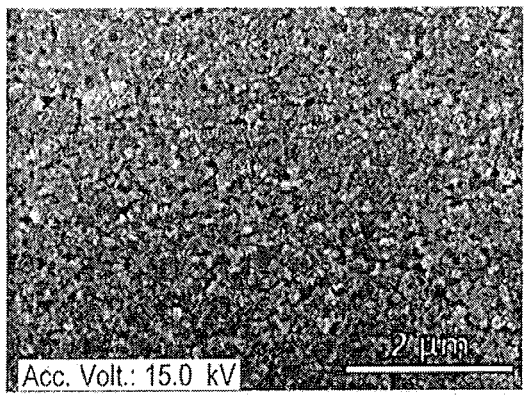 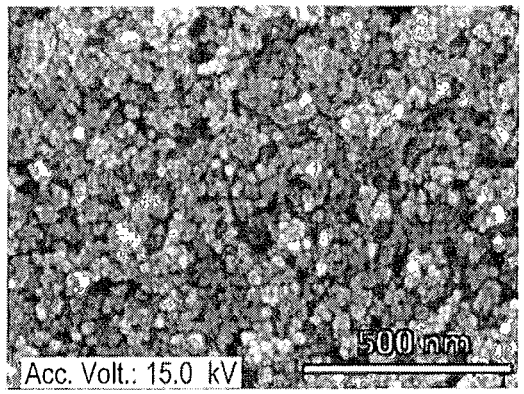
*FIG. 4A*     *FIG. 4B*
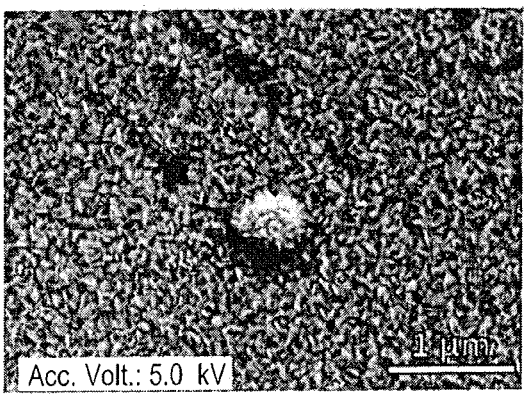 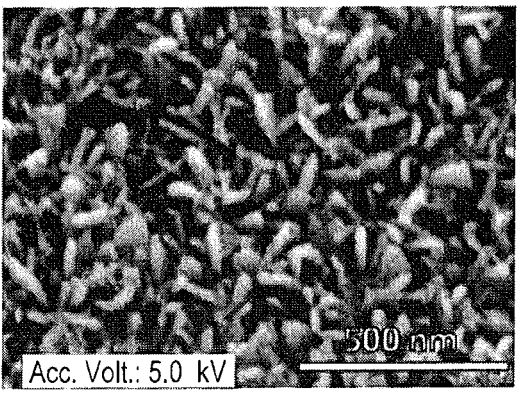
*FIG. 4C*     *FIG. 4D*

QUANTUM DOT-SENSITIZED SOLAR CELL AND METHOD OF MAKING THE SAME

BACKGROUND

1. Field

The disclosure of the present patent application relates to quantum dot-sensitized solar cells (QDSSCs), and particularly to a quantum dot-sensitized solar cell having a photoelectrode which includes a tin dioxide ($SnO_2$) nanograss buffer layer.

2. Description of the Related Art

There is presently great interest in third-generation solar cells, such as quantum dot sensitized solar cells (QDSSCs), due to their inorganic structures, high theoretical efficiencies, ease of fabrication and relative low cost. Various metal chalcogenide-semiconductors, such as CdS, CdSe, PbS, $CdSe_xS_{1-x}$, $CuInS_2$, $CuInZn_S$, etc. have been investigated as promising sensitizers for the QDSSCs due to their tunable band gap, high absorption coefficient and multiple exciton generation (MEG). A typical structure of the QDSSC is composed of a QD-sensitized $TiO_2$ photoelectrode, a polysulfide electrolyte ($S^{2-}/Sn^{2-}$), and a counter electrode, which leads to various hetero-interfaces. Although quantum dots (QDs) have unique characteristics, thus far, QDSSCs have achieved a low power conversion efficiency (PCE) of 12%, due to the recombination of charges that occur at the photoanode/QDs/electrolyte interfaces. Due to the potential that QDSSCs show, it would be desirable to be able to overcome this limitation. Thus, a quantum dot-sensitized solar cell and a method of making the same solving the aforementioned problems are desired.

SUMMARY

The quantum dot-sensitized solar cell (QDSSC) includes a photoelectrode, a counter electrode, and an electrolyte sandwiched between the photoelectrode and the counter electrode. The photoelectrode is formed from a titanium dioxide ($TiO_2$) layer, a cadmium sulfide (CdS) quantum dot sensitizer layer, and a tin dioxide ($SnO_2$) nanograss layer sandwiched between the titanium dioxide ($TiO_2$) layer and the cadmium sulfide (CdS) quantum dot sensitizer layer. As non-limiting examples, the counter electrode may be made of copper sulfide (CuS), and the electrolyte may be a polysulfide electrolyte.

The quantum dot-sensitized solar cell is made by applying a titanium dioxide paste on a fluorine-doped tin oxide substrate. The titanium dioxide paste and the fluorine-doped tin oxide substrate are heated to form a mesoporous titanium dioxide electrode. Tin dioxide nanograss is then grown on the mesoporous titanium dioxide electrode using chemical bath deposition to form a pre-loaded electrode. The cadmium sulfide quantum dots are loaded on the pre-loaded electrode using successive ionic layer adsorption and reaction cycles to form the photoelectrode. The electrolyte is then sandwiched between the photoelectrode and the counter electrode.

These and other features of the present subject matter will become readily apparent upon further review of the following specification.

BRIEF DESCRIPTION OF THE DRAWINGS

FIG. 4A is a scanning electron microscope (SEM) image for $TiO_2$ on a fluorine-doped tin oxide (FTO) substrate, shown on the order of 2 μm.

FIG. 4B is an SEM image of the $TiO_2$ on the FTO substrate of FIG. 4B, shown on the order of 500 nm.

FIG. 4C is an SEM image of $TiO_2/SnO_2$ NGs on an FTO substrate, shown on the order of 1 μm.

FIG. 4D is an SEM image of the $TiO_2/SnO_2$ NGs on the FTO substrate of FIG. 4C, shown on the order of 500 nm.

Similar reference characters denote corresponding features consistently throughout the attached drawings.

DETAILED DESCRIPTION OF THE PREFERRED EMBODIMENTS

Figure 1:
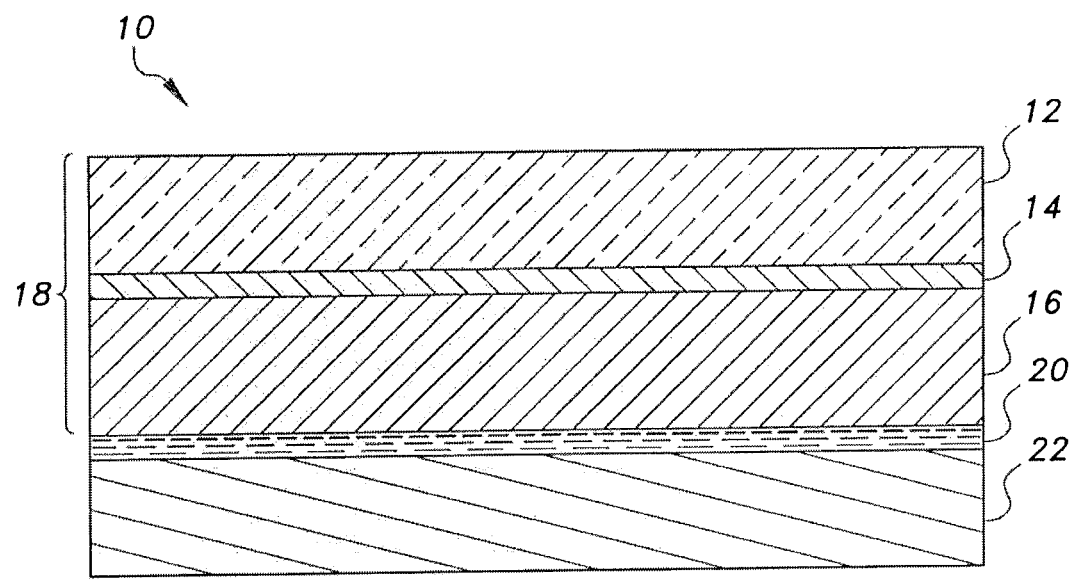
FIG. 1 is a side view in section of a quantum dot-sensitized solar cell.

As illustrated in FIG. 1, the quantum dot-sensitized solar cell (QDSSC) 10 includes a photoelectrode 18, a counter electrode 22, and an electrolyte 20 sandwiched between the photoelectrode 18 and the counter electrode 22. The photoelectrode 18 is formed from a titanium dioxide ($TiO_2$) layer 12, a cadmium sulfide (CdS) quantum dot sensitizer layer 16, and a tin dioxide ($SnO_2$) nanograss layer 14 sandwiched between the titanium dioxide ($TiO_2$) layer 12 and the cadmium sulfide (CdS) quantum dot sensitizer layer 16. As non-limiting examples, the counter electrode 22 may be made of copper sulfide (CuS), and the electrolyte 20 may be a polysulfide electrolyte. As a further non-limiting example, the polysulfide electrolyte may be formed from 1 M $Na_2S$, 2 M S and 0.1 M KCl in methanol and water solution (7:3). The electrolyte 20 may be sealed with the photoelectrode 18 and the counter electrode 22 using any suitable type of sealant, such as Meltonix 1170-60, manufactured by Solaronix SA of Switzerland.

In order to prepare photoelectrode 18, prior to the deposition, fluorine-doped tin oxide (FTO, 13Ω $sq^{-2}$) glasses (1.3×1.5 $cm^2$) were washed with acetone, ethanol and deionized (DI) water for 10 minutes each. Mesoporous $TiO_2$ electrodes were prepared by doctor-blading a $TiO_2$ paste (20 nm diameter, manufactured by Solaronix SA of Switzerland) onto the FTO substrates. The samples were maintained at 450° C. for 30 minutes. Then, tin dioxide nanograss ($SnO_2$ NGs) layer 14 was grown on the $TiO_2$ surface via a facile chemical bath deposition (CBD) reaction. Particularly, 0.05 M $SnCl_2.2H_2O$ and 0.15 M hexamethylenetetramine (HMTA) were mixed in 70 mL of DI water under magnetic stirring for 30 minutes. The as-prepared $TiO_2$ samples were dipped horizontally into the $SnO_2$ growth solution and heated at 95° C. for 10 h. The HMTA in the precursor solution not only serves as a surfactant by reducing the surface tension between the growth solution and the substrate, but it also supports the growth of the $SnO_2$ layer. After deposition, the $SnO_2$ NGs loaded FTO/$TiO_2$ films were rinsed with DI water and ethanol, and then heated at 450° C. for 30 mins, producing $TiO_2$/$SnO_2$ NGs electrodes.

Next, the cadmium sulfide quantum dots (CdS QDs) were loaded on the $TiO_2$/$SnO_2$ NGs by a facile successive ionic layer adsorption and reaction (SILAR) method. Particularly, the $TiO_2$/$SnO_2$ NGs films were dipped in aqueous 0.1 M $Cd(CH_3COO)_2.2H_2O$ solution for 5 mins, rinsed with ethanol, then dipped in aqueous 0.1 M $Na_2S$ solution for 5 mins, and then again rinsed with ethanol. This process is a single SILAR cycle, and a total of eight SILAR cycles were repeated to produce $TiO_2$/$SnO_2$ NGs/CdS films. Photoelectrode 18 can be formed from the $TiO_2$/$SnO_2$ NGs/CdS film on the FTO substrate.

The CuS counter electrodes 22 were prepared on FTO substrates using a CBD method. The QDSSCs 10 were formed by sandwiching the $TiO_2$/$SnO_2$ NGs/CdS photoelectrodes 18 and the CuS counter electrodes 22 using a sealant (Meltonix 1170-60, manufactured by Solaronix SA of Switzerland) with the polysulfide electrolyte 20. In experiments, polysulfide electrolyte 20 was formed from 1 M $Na_2S$, 2 M S and 0.1 M KCl in a methanol and water solution (7:3).

As will be discussed in detail below, the crystalline phase, elemental analysis and morphology of the electrodes were investigated using X-ray diffraction (XRD) with a D/max 2400 X-ray diffractometer manufactured by Rigaku® of Japan, X-ray photon spectroscopy (XPS) using an ESCALAB 250 analyzer manufactured by Thermo Scientific® of Massachusetts, and a scanning electron microscope (SEM) using an S-2400 model SEM, manufactured by Hitachi® of Japan, with energy-dispersive X-ray spectroscopy (EDX, 15 kV) mapping characterizations. The optical absorption properties of the as-prepared electrodes were analyzed by UV-visible absorption spectra using a 3220UV UV-vis spectrophotometer manufactured by Optizen. The photocurrent-voltage (J-V) measurements were conducted using a solar simulator manufactured by Abet Technologies, which exhibits an intensity of 100 mW $cm^{-2}$. Electrochemical impedance spectroscopy (EIS) was carried out using an SP-150 electrochemical workstation manufactured by BioLogic, with a frequency range of 500 kHz to 0.1 Hz and an AC amplitude of 10 mV.

Figure 2:
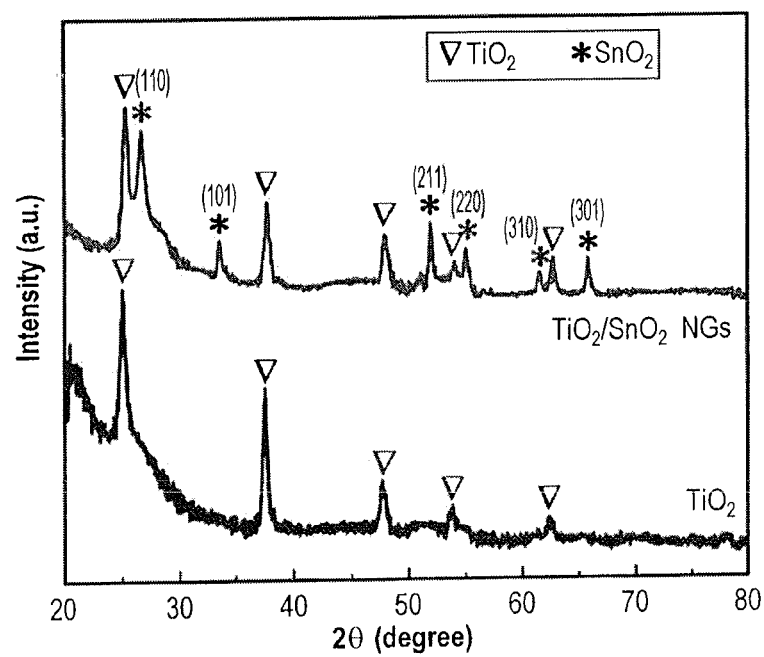
FIG. 2 shows X-ray diffraction (XRD) patterns for titanium dioxide ($TiO_2$) and tin dioxide nanograss ($SnO_2$ NGs) grown on $TiO_2$ ($TiO_2/SnO_2$ NGs).

The XRD patterns of the as-prepared $TiO_2$ and $TiO_2$/$SnO_2$ NGs are shown in FIG. 2. As seen in FIG. 2, both the $TiO_2$ and $TiO_2$/$SnO_2$ NGs samples exhibit peaks at 2θ=25.1°, 37.5°, 47.8°, 53.9° and 62.3, which are well-matched with the $TiO_2$ tetragonal anatase structure (JCPDS:21-1272). After the deposition of $SnO_2$ over the $TiO_2$ surface, new diffraction peaks were observed at 2θ=26.7°, 33.6°, 51.9°, 54.9°, 61.5° and 65.8°, which are consistent with the $SnO_2$ tetragonal structure (JCPDS:41-1445).

Figure 3A:
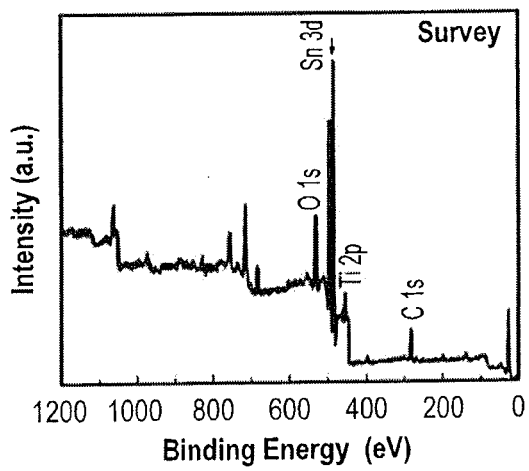
FIG. 3A shows X-ray photon spectroscopy (XPS) spectra of a $TiO_2/SnO_2$ NGs sample electrode.
Figure 3B:
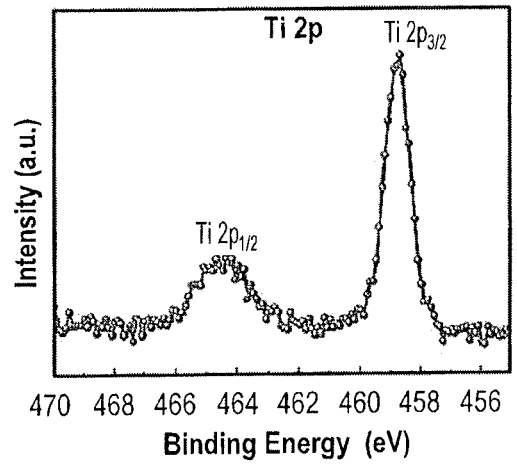
FIG. 3B shows the XPS spectra associated with Ti 2p in the $TiO_2/SnO_2$ NGs sample electrode of FIG. 3A.
Figure 3C:
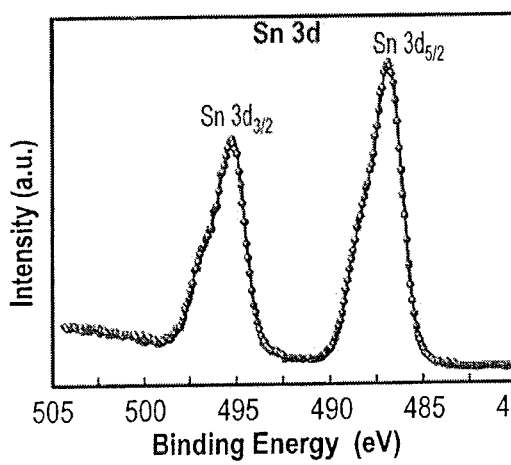
FIG. 3C shows the XPS spectra associated with Sn 3d in the $TiO_2/SnO_2$ NGs sample electrode of FIG. 3A.
Figure 3D:
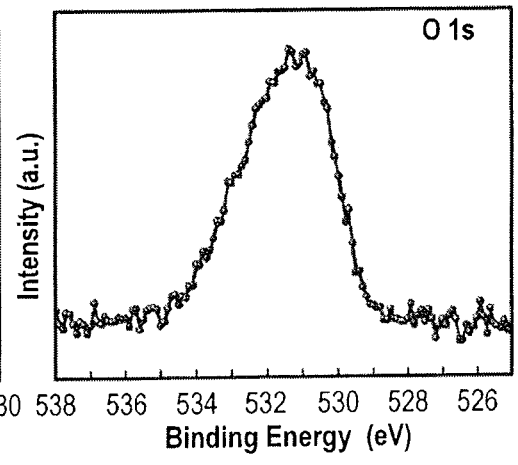
FIG. 3D shows the XPS spectra associated with O 1s in the $TiO_2/SnO_2$ NGs sample electrode of FIG. 3A.

XPS characterization was performed to investigate the valence states of elements in the $TiO_2$/$SnO_2$ NGs electrode. The XPS survey spectra of the $TiO_2$/$SnO_2$ NGs sample is shown in FIG. 3A, which clearly shows the presence of only Ti, Sn, O and C elements. The presence of the carbon element in the total survey scan spectrum is ascribed to the exposure of the sample to air. As shown in FIG. 3B, the XPS spectrum of Ti 2p exhibits the Ti $2p_{3/2}$ and Ti $2p_{1/2}$ peaks that are centered at 458.7 eV and 464.5 eV, respectively. These spectra are consistent with the presence of a $Ti^{4+}$ valence state. Due to the spin-orbit coupling of Ti 2p, the obtained peaks are separated by 5.8 eV. The Sn 3d spectrum shown in FIG. 3C exhibits two peaks at 486.8 eV and 495.3 eV, which are indexed to Sn $3d_{5/2}$ and Sn $3d_{3/2}$, respectively, and agree with the $Sn^{4+}$ state in $SnO_2$. As shown in FIG. 3D, the spectrum of O 1s displays a peak that is centered at 530.9 eV, corresponding to $O_2$ in the $TiO_2$ and $SnO_2$ crystal lattices. The XRD and XPS results confirmed the formation of $SnO_2$ NGs on the $TiO_2$ surface.

The surface morphologies of the as-prepared $TiO_2$ and $TiO_2$/$SnO_2$ NGs electrodes were studied using SEM analysis, and the corresponding images are shown in FIGS. 4A and 4B for $TiO_2$ on a FTO substrate, and in FIGS. 4C and 4D for $SnO_2$ on the $TiO_2$ surface ($TiO_2$/$SnO_2$) NGs. As shown in FIG. 4A, the $TiO_2$ nanoparticles are uniformly distributed throughout the substrate. It can be clearly seen from FIG. 4B, that the $TiO_2$ exhibits spherical nanoparticle morphology with diameters in the range of ~16 to ~20 nm. As discussed above, the CBD method was used to grow the $SnO_2$ nanostructures on the surface of the $TiO_2$. It can be clearly observed in FIG. 4C that the $SnO_2$ exhibits the nanograss (NGs) morphology. The diameter of the $SnO_2$ NGs was estimated to be in the range of ~21 to ~46 nm (FIG. 4D). The SEM images clearly reveal that the $SnO_2$ NGs nanostructures were successfully grown on the $TiO_2$ surface. In addition, SEM-EDX color mapping was carried out to examine the distribution of elements in the $TiO_2$/$SnO_2$ NGs, revealing the homogeneous distribution of Ti, Sn and O elements in the as-prepared $TiO_2$/$SnO_2$ NGs electrode.

Figure 5:
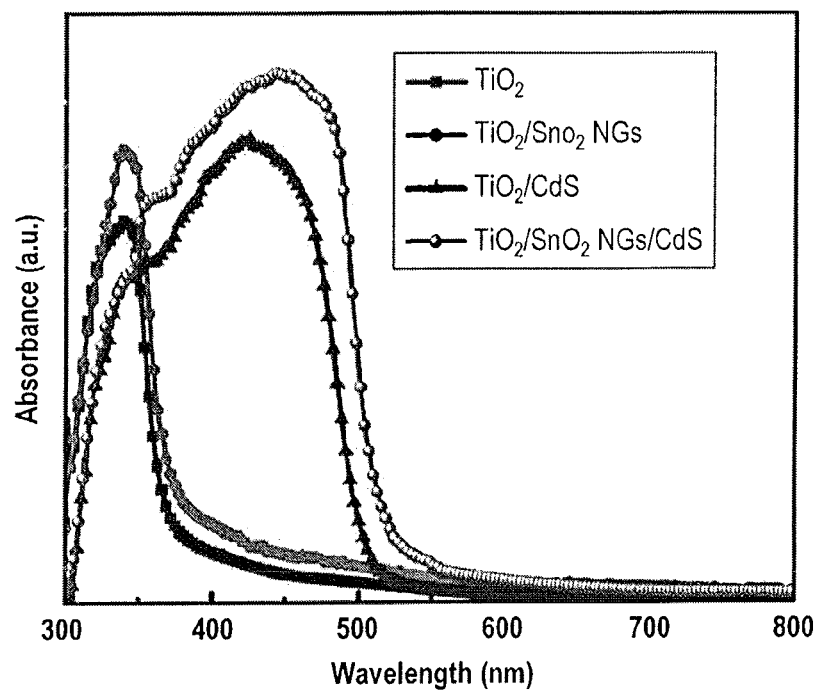
FIG. 5 shows a comparison of ultraviolet-visible light (UV-vis) absorption spectra of $TiO_2$, $TiO_2/SnO_2$ NGs, titanium dioxide with a cadmium sulfide (CdS) quantum dot sensitizer ($TiO_2/CdS$) and $TiO_2/SnO_2$ NGs with the CdS quantum dot sensitizer ($Ti_2/SnO_2$ NGs/CdS).

UV-vis absorption measurements were carried out to demonstrate the optical properties of the $TiO_2$, $TiO_2$/$SnO_2$ NGs, $TiO_2$/CdS and $TiO_2$/$SnO_2$ NGs/CdS samples, and the results are plotted in FIG. 5 in the range of 300 to 800 nm. The $TiO_2$ sample exhibits an absorption edge at around 378 nm. The growth of $SnO_2$ NGs on the $TiO_2$ surface increased the absorption intensity. In addition, the absorption onset of $TiO_2$/$SnO_2$ NGs increased to 388 nm. The absorption onsets of the $TiO_2$/CdS and $Ti_2$/$SnO_2$ NGs/CdS samples were measured to be 510 nm and 525 nm, respectively. The absorption onset of the Ti$_2$/SnO$_2$ NGs/CdS electrode was increased and had a higher absorbance when compared to Ti$_2$/CdS. These observations can be attributed to the growth of SnO$_2$ NGs passivation/barrier layer over the TiO$_2$ surface. Further, the SnO$_2$ NGs interlayer supports the nucleation and growth of CdS QDs, which results in the high rate of absorption of the TiO$_2$/SnO$_2$ NGs/CdS electrode.

Figure 6A:
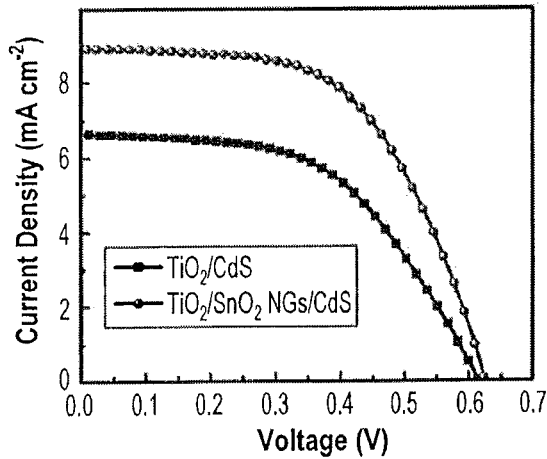
FIG. 6A shows a comparison of current density vs. voltage (J-V) plots between $TiO_2/CdS$ and $TiO_2/SnO_2$ NGs/CdS.
Figure 6B:
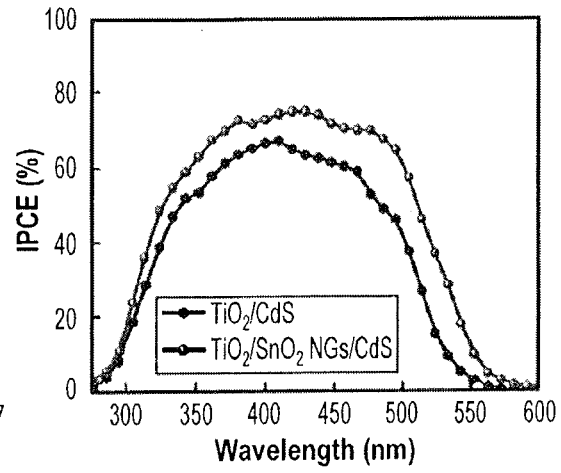
FIG. 6B shows a comparison of incident photon to current conversion efficiency (IPCE) as a function of wavelength between $TiO_2/CdS$ and $TiO_2/SnO_2$ NGs/CdS.

To evaluate the impact of the SnO$_2$ NGs interlayer on the photoanodes, the photovoltaic behaviors of TiO$_2$/CdS and TiO$_2$/SnO$_2$ NGs/CdS-based QDSSCs were investigated. The J-V profiles of the as-fabricated QDSSCs were measured under one sun illumination, and the related photovoltaic considerations are shown in FIG. 6A and Table 1 below. The TiO$_2$/CdS QDSSC exhibits a short-circuit current density (J$_{SC}$) of 6.64 mA cm$^{-2}$, an open circuit voltage (V$_{OC}$) of 0.614 V, and a fill factor (FF) of 0.530, resulting in a power conversion efficiency (PCE) of 2.16%. When a SnO$_2$ NGs layer was grown on a TiO$_2$ surface (TiO$_2$/SnO$_2$ NGs/CdS), the J$_{SC}$, V$_{OC}$ and FF were considerably improved to 8.92 mA cm$^2$, 0.619 V, and 0.570, respectively, resulting in an elevated PCE of 3.15%, which is much higher than the PCE of a TiO$_2$/CdS (2.16%) photoelectrode. The enhanced V$_{OC}$ and J$_{SC}$ of the TiO$_2$/SnO$_2$ NGs/CdS-based QDSSCs are attributed to the reduced charge recombination and the fast charge transfer at the TiO$_2$/QDs/electrolyte interfaces. Thus, the PCE of the QDSSC has improved from 2.16% to 3.15% by the growth of the SnO$_2$ NGs interlayer over the TiO$_2$ surface. Furthermore, an incident photon to current conversion efficiency (IPCE) study was carried out to illustrate the light absorption and electron generation behaviors in the QDSSCs. FIG. 6B shows the IPCE plots of the as-prepared QDSSCs. It can be seen from the IPCE spectra that the introduction of the SnO$_2$ NGs interlayer enhanced the IPCE response from 66% to 75% and also enlarged the IPCE response edge from 548 nm to 568 nm. The TiO$_2$/SnO$_2$ NGs/CdS-based QDSSCs exhibit a higher IPCE response than the TiO$_2$/CdS, which is in good agreement with the J$_{SC}$ of the J-V plots.

TABLE 1

Photovoltaic parameters of QDSSCs based on TiO2/CdS and TiO2/SnO2 NGs/CdS photoelectrodes under one sun illumination

| | V$_{OC}$ (V) | J$_{SC}$ (mA cm$^{-2}$) | FF | PCE % | R$_{ct}$ (Ω) | C$_μ$ (μm) | τ$_e$ (ms) |
|---|---|---|---|---|---|---|---|
| TiO$_2$/CdS | 0.614 | 6.64 | 0.530 | 2.16 | 8.78 | 1358 | 11.92 |
| TiO$_2$/SnO$_2$ NGs/CdS | 0.619 | 8.92 | 0.570 | 3.15 | 27.94 | 2183 | 60.99 |

Figure 6C:
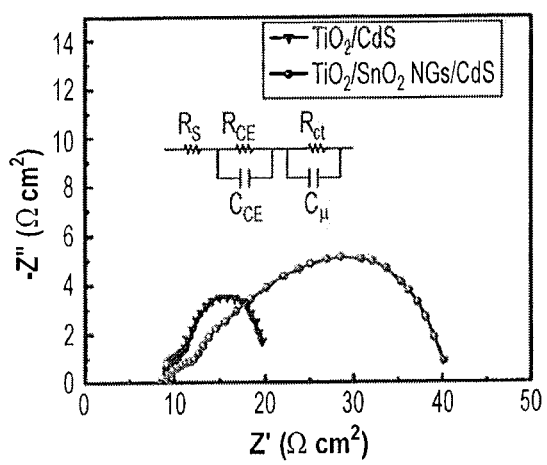
FIG. 6C shows a comparison of electrical impedance spectroscopy (EIS) Nyquist plots between a quantum dot-sensitized solar cell (QDSSC) with a $TiO_2/CdS$ photoelectrode and a QDSSC with a $TiO_2/SnO_2$ NGs/CdS photoelectrode.

In order to demonstrate the impact of the SnO$_2$-NGs interlayer on the photoelectrode films, electrical impedance spectroscopy (EIS) measurements were conducted under forward bias (V$_{OC}$) and illumination. The Nyquist plots of the TiO$_2$/CdS and TiO$_2$/SnO$_2$ NGs/CdS-based QDSSCs are shown in FIG. 6C. The Nyquist plots of both devices exhibit the two semicircle-type shapes, in which the first (small) semicircle is obtained in the high-frequency region and represents the charge transfer resistance (R$_{CE}$), the chemical capacitance (C$_{CE}$) at the interface of the counter electrode/ electrolyte, and the series resistance (R$_S$) which is obtained in the high-frequency region, where the phase is zero. The recombination resistance (R$_{ct}$) at the TiO$_2$/QD/electrolyte interface and the chemical capacitance (C$_μ$) indexed to the bigger semicircle, which is obtained at mid/low frequency. Based on the equivalent circuit model (inset of FIG. 6C) and using Z-view software, the Nyquist plots were fitted to obtain the R$_{ct}$ values, and the fitting results are summarized in Table 1 above. There is no considerable change in the R$_{CE}$, which is due to the usage of similar electrolytes and counter electrodes in the fabrication of the QDSSCs. However, the R$_{ct}$ of the TiO$_2$/SnO$_2$ NGs/CdS-based QDSSC (27.94 Ωcm$^2$) is much higher than that of the TiO$_2$/CdS (8.78 Ωcm$^2$). The higher Ra of the TiO$_2$/SnO$_2$ NGs/CdS-based QDSSC demonstrates that the growth of SnO$_2$ NGs over the TiO$_2$ surface successfully suppresses the electron recombination at the TiO$_2$/QDs/electrolyte interfaces. Thus, the growth of the SnO$_2$ NGs interlayer hinders the interfacial charge recombination and enhances the photovoltaic performance (J$_{SC}$ and FF). Moreover, the QDSSC based on the TiO$_2$/SnO$_2$ NGs/CdS photoelectrode achieves higher C$_μ$ (2183 μF) than that of the TiO$_2$/CdS (1358 μF) system. The higher C$_μ$ of the Ti$_2$/SnO$_2$ NGs/CdS system demonstrates the improved collection of photo-excited electrons into the conduction band of the photoanode, which is mainly due to the hindered recombination at the TiO$_2$/QDs/electrolyte interfaces. Further, the electron life time (τ$_c$) of the QDSSCs can be obtained as τ$_c$=R$_{ct}$×C$_μ$. It should be noted that the T of the TiO$_2$/CdS with SnO$_2$ NGs interlayer (60.99 ms) is much higher than that of the SnO$_2$ NGs-free device (11.92 ms), which reveals the higher charge collection efficiency of the TiO$_2$/SnO$_2$ NGs/CdS system.

Figure 6D:
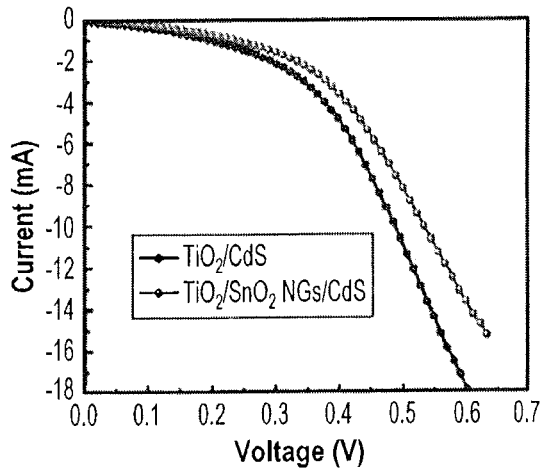
FIG. 6D shows a comparison of J-V plots under a dark current between the QDSSC with a $TiO_2/CdS$ photoelectrode and the QDSSC with a $TiO_2/SnO_2$ NGs/CdS photoelectrode.

Under dark conditions, the J-V plots of the TiO$_2$/CdS and TiO$_2$/SnO$_2$ NGs/CdS-based QDSSCs were obtained and are shown in FIG. 6D. The electron recombination occurs at the interfaces of TiO$_2$/QDs and TiO$_2$/electrolyte, and this is the source of the dark current. Thus, a dark current study is a useful indicator of charge recombination. With the introduction of the SnO$_2$ NGs interlayer, the TiO$_2$/SnO$_2$ NGs/CdS device delivers the reduced dark current, which is lower compared with that of the TiO$_2$/CdS device. The reduction of the dark current arose from an enhancement in electron transport with a decrease in the internal resistance. As a result, the electron recombination was effectively reduced by the introduction of the SnO$_2$ NGs interlayer, and this contributed to the enhanced current and decreased electron loss.

Figure 7A:
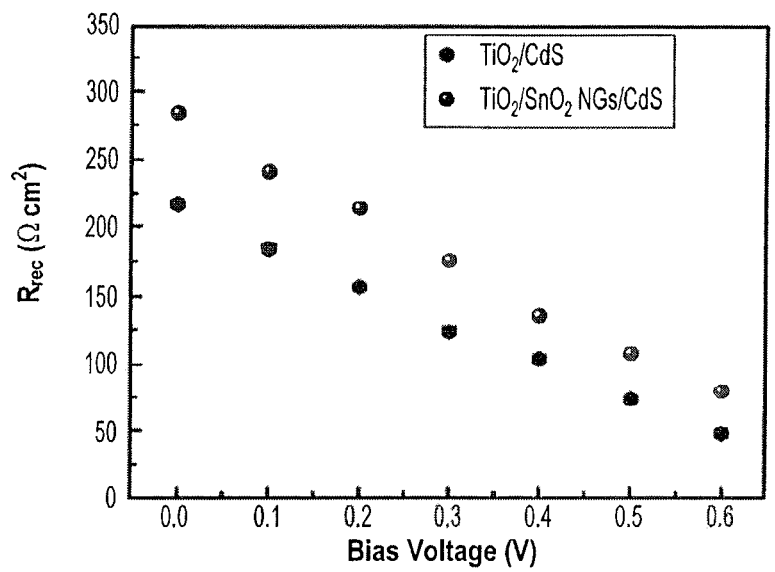
FIG. 7A shows a comparison of recombination resistance ($R_{rec}$) plots at varying bias voltages between the QDSSC with a $TiO_2/CdS$ photoelectrode and the QDSSC with a $TiO_2/SnO_2$ NGs/CdS photoelectrode.
Figure 7B:
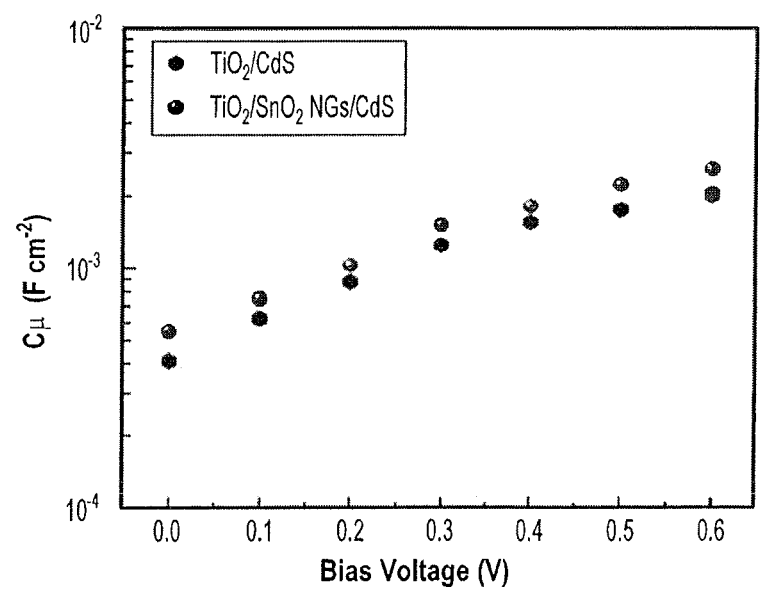
FIG. 7B shows a comparison of chemical capacitance ($C_\mu$) plots at varying bias voltages between the QDSSC with a $TiO_2/CdS$ photoelectrode and the QDSSC with a $TiO_2/SnO_2$ NGs/CdS photoelectrode.

Furthermore, to investigate the impact of the SnO$_2$ NGs interlayer on the performance of the QDSSCs, EIS tests were conducted at various bias applied voltages under dark conditions in the 500 kHz to 100 mHz frequency range. The obtained recombination resistance (R$_{rec}$) and chemical capacitance (C$_μ$) from the corresponding EIS tests are shown in FIGS. 7A and 7B, respectively. The R$_{rec}$ and C$_μ$ reveal that the charge recombination process occurs at the TiO$_2$/QDs/ electrolyte interfaces. A higher R$_{rec}$ represents the low recombination rate and greater C$_μ$ values denote the Fermi level upward shift, yielding the enhanced V$_{OC}$. It can be seen from FIG. 7A that the R$_{rec}$ values of both devices decrease with the increment of the forward bias voltage due to the increased Fermi level of TiO$_2$ at the forward bias. Also, TiO$_2$/SnO$_2$ NGs/CdS QDSSCs exhibit higher R$_{rec}$ values than the Ti$_2$/CdS device under identical bias voltages. The recombination rate is inversely proportional R$_{rec}$. Moreover, the higher C$_μ$ values of the TiO$_2$/SnO$_2$ NGs/CdS device denote the upward shift of the Fermi level of TiO$_2$, resulting in a large V$_{OC}$. These EIS studies reveal the reduced recombination rate for the TiO$_2$/SnO$_2$ NGs/CdS device, which is favorable for the improved J$_{SC}$ and FF.

Figure 8A:
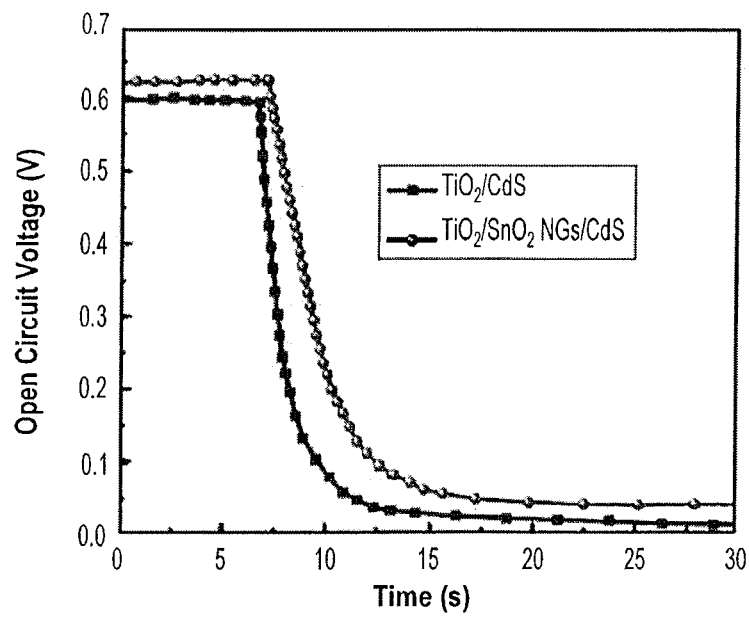
FIG. 8A shows a comparison of open-circuit voltage ($V_{OC}$) decay profiles between the QDSSC with a $TiO_2/CdS$ photoelectrode and the QDSSC with a $TiO_2/SnO_2$ NGs/CdS photoelectrode.
Figure 8B:
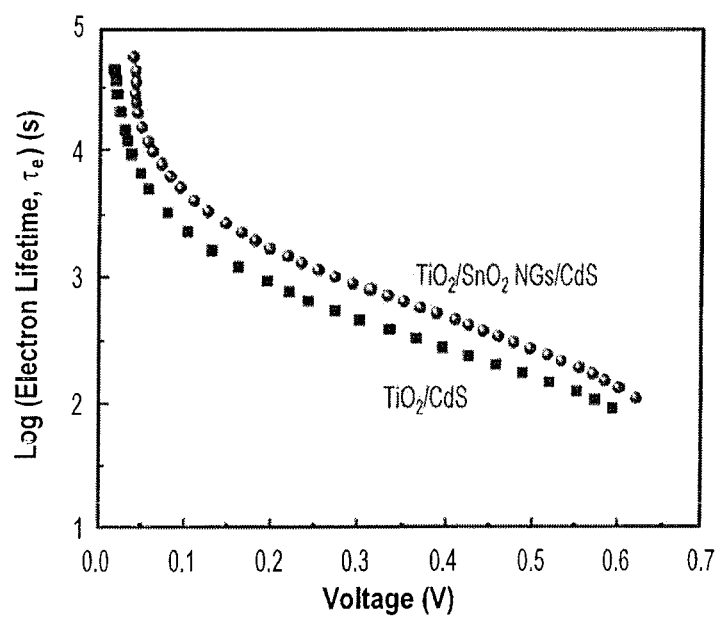
FIG. 8B shows a comparison of electron lifetime ($\tau_e$) between the QDSSC with a $TiO_2/CdS$ photoelectrode and the QDSSC with a $TiO_2/SnO_2$ NGs/CdS photoelectrode.

The excited electrons life time was examined using the open-circuit voltage (V$_{OC}$) decay studies with time. Initially, the QDSSCs were irradiated with one sun illumination to a steady voltage, then the illumination was turned off and the V$_{OC}$ decay data was obtained. FIG. 8A shows the V$_{OC}$ decay profiles of the TiO$_2$/CdS and TiO$_2$/SnO$_2$ NGs/CdS-based QDSSCs. The V$_{OC}$ decay plots clearly exhibit the continued monitoring of V$_{OC}$ values under illumination and approach to decay after switching off the illumination. It is evident from the V$_{OC}$ decay plots that the TiO$_2$/SnO$_2$ NGs/CdS-based QDSSCs exhibit a slower voltage decay rate than the TiO$_2$/CdS photoanode. This behavior is mainly attributed to the SnO$_2$ NGs interlayer, which efficiently suppresses the charge recombination at the Ti$_2$/QDs/electrolyte interfaces and also promotes efficient electron transfer. Further, the electron life time ($\tau_e$) can be estimated as $$\tau_e = -\left(\frac{k_B T}{e}\right)\left(\frac{dV_{OC}}{dt}\right)^{-1},$$

where k$_B$, T and e are the Boltzmann constant, temperature and electron charge, respectively. FIG. 8B shows the plot of electron life time ($\tau_e$, in log sign) as a function of V$_{OC}$. The TiO$_2$/SnO$_2$ NGs/CdS-based QDSSCs deliver longer $\tau_e$ values than that of TiO$_2$/CdS, implying a suppressed recombination of the photo-generated electrons, leading to the efficient charge transfer, which agrees well with the EIS analysis.

Figure 9B:
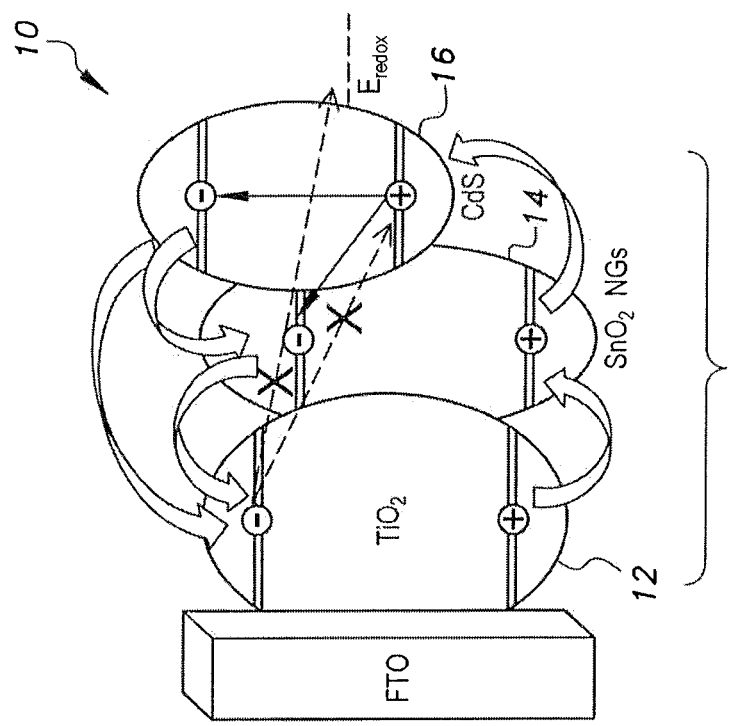
FIG. 9B schematically illustrates the charge transfer pathways in the QDSSC with a $TiO_2/SnO_2$ NGs/CdS photoelectrode.
Figure 9A:
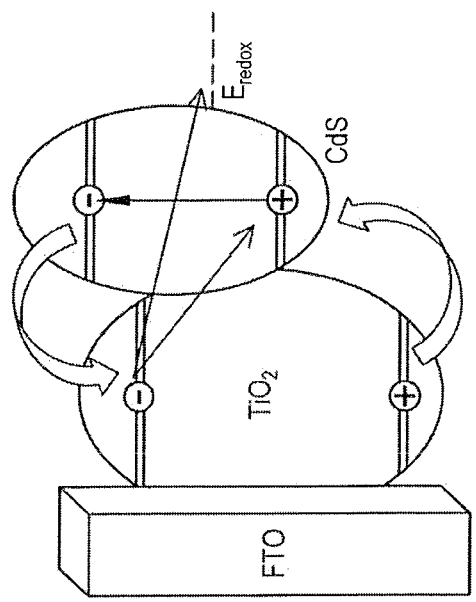
FIG. 9A schematically illustrates the charge transfer pathways in the QDSSC with a $TiO_2/CdS$ photoelectrode.

FIGS. 9A and 9B show the impact of the SnO$_2$ NGs interlayer on the charge transfer mechanism in QDSSCs. As shown in FIG. 9A, upon illumination, CdS captures the photons and produces the electron-hole pairs (i.e., the excitons). Then, the electrons transfer into the TiO$_2$ conduction band, while the holes are reduced by the polysulfide electrolyte. Simultaneously, the possibility of charge recombination also takes place at the interfaces of TiO$_2$/CdS QDs/electrolyte, which results in poor photovoltaic performance. Thus, the SnO$_2$ NGs interlayer is introduced between the TiO$_2$ and CdS QDs (TiO$_2$/SnO$_2$ NGs/CdS) to prevent the charge recombination (FIG. 9B). The introduction of the SnO$_2$ NGs interlayer on the TiO$_2$ surface retards the back injection of the electron from the TiO$_2$ to the QDs, and also prevents the injection of the excited electron from the TiO$_2$ to redox couple, resulting in the high photovoltaic performance. Therefore, introducing the SnO$_2$ NGs interlayer over the TiO$_2$ surface achieves desirable properties, such as a wide solar light-harvesting ability, and an enhanced charge transfer and suppressed charge recombination at the TiO$_2$/QDs/electrolyte interfaces.

It is to be understood that the quantum dot-sensitized solar cell and the method of making the same are not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. A method of making a quantum dot-sensitized solar cell, comprising the steps of:
providing a photoelectrode, the photoelectrode being made by the steps consisting of:
applying a titanium dioxide paste on a fluorine-doped tin oxide substrate;
heating the titanium dioxide paste and the fluorine-doped tin oxide substrate to form a mesoporous titanium dioxide electrode;
growing tin dioxide nanograss on the mesoporous titanium dioxide electrode using chemical bath deposition to form a pre-loaded electrode, wherein growing the tin dioxide nanograss on the mesoporous titanium dioxide electrode comprises the steps of:
mixing SnCl2.H2O and hexamethylenetetramine to form a tin dioxide growth solution;
dipping the mesoporous titanium dioxide electrode in the tin dioxide growth solution; and
heating the mesoporous titanium dioxide electrode and the tin dioxide growth solution;
loading cadmium sulfide quantum dots on the pre-loaded electrode using successive ionic layer adsorption and reaction cycles to form a photoelectrode, wherein each said ionic layer adsorption and reaction cycle comprises:
dipping the pre-loaded electrode in an aqueous Cd(CH3COO)2.2H2O solution;
rinsing the pre-loaded electrode with ethanol;
dipping the pre-loaded electrode in a Na2S solution; and
rinsing the pre-loaded electrode with ethanol;
providing a counterelectrode; and
sandwiching an electrolyte between the photoelectrode and the counter electrode.

2. The method of making a quantum dot-sensitized solar cell as recited in claim 1, wherein the step of heating the titanium dioxide paste and the fluorine-doped tin oxide substrate comprises heating the titanium dioxide paste and the fluorine-doped tin oxide substrate at 450° for 30 minutes.

3. The method of making a quantum dot-sensitized solar cell as recited in claim 1, wherein the step of loading the cadmium sulfide quantum dots on the pre-loaded electrode comprises eight successive ionic layer adsorption and reaction cycles.

4. The method of making a quantum dot-sensitized solar cell as recited in claim 1, wherein the counter electrode is a copper sulfide counter electrode.

5. The method of making a quantum dot-sensitized solar cell as recited in claim 1, wherein the step of sandwiching the electrolyte between the photoelectrode and the counter electrode comprises sandwiching a polysulfide electrolyte between the photoelectrode and the counter electrode.

* * * * *